US009089086B2

(12) United States Patent
Harada et al.

(10) Patent No.: US 9,089,086 B2
(45) Date of Patent: Jul. 21, 2015

(54) APPARATUS FOR MOUNTING ELECTRONIC COMPONENT

(75) Inventors: Tohru Harada, Kawasaki (JP); Mitsuo Takeuchi, Kawasaki (JP); Hirokazu Yamanishi, Kawasaki (JP); Yoshiaki Yanagida, Kawasaki (JP); Toru Okada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 979 days.

(21) Appl. No.: 13/225,902

(22) Filed: Sep. 6, 2011

(65) Prior Publication Data

US 2012/0060356 A1    Mar. 15, 2012

(30) Foreign Application Priority Data

Sep. 15, 2010   (JP) ................................. 2010-206904

(51) Int. Cl.
*B23P 19/00* (2006.01)
*H05K 13/04* (2006.01)
*H01L 23/00* (2006.01)

(52) U.S. Cl.
CPC ............ *H05K 13/0486* (2013.01); *H01L 24/75* (2013.01); *H01L 24/81* (2013.01); *Y10T 29/49004* (2013.01); *Y10T 29/53022* (2013.01)

(58) Field of Classification Search
CPC .... H05K 13/0486; H01L 24/75; H01L 24/81; Y10T 29/53022; Y10T 29/49004
USPC ................... 29/709, 720, 721, 739–741, 743; 228/180.1, 264; 356/399, 400
See application file for complete search history.

(56) References Cited

U.S. PATENT DOCUMENTS 5,457,538 A * 10/1995 Ujiie .............................. 356/399
6,435,401 B1 * 8/2002 Miitsu et al. .................. 228/264

FOREIGN PATENT DOCUMENTS

| JP | 5-198621 A | 8/1993 | |
| JP | 08-051299 | * 2/1996 | ............ H05K 13/04 |
| JP | 10-303546 A | 11/1998 | |
| JP | 11-297749 A | 10/1999 | |
| JP | 2003-152329 A | 5/2003 | |

* cited by examiner

*Primary Examiner* — Donghai D Nguyen
(74) *Attorney, Agent, or Firm* — Westerman, Hattori, Daniels & Adrian, LLP (57) ABSTRACT

An apparatus for mounting an electronic component includes a heating head that moves relative to the electronic component placed on a printed board, inclines according to the inclination of the electronic component, comes into contact with the electronic component, and heats a joining material that joins the printed board and the electronic component; a first sensor that measures the position and the inclination of the heating head; a second sensor that measures the position and the inclination of the printed board; and, a control unit that calculates the position and the inclination of the electronic component based on a measurement result of the first sensor in a state where the heating head is in contact with the electronic component, and determines the melted state of the joining material based on the measurement result of the second sensor and the position and the inclination of the electronic component.

6 Claims, 7 Drawing Sheets

APPARATUS FOR MOUNTING ELECTRONIC COMPONENT

CROSS-REFERENCE TO RELATED APPLICATIONS

This application is based upon and claims the benefit of priority of the prior Japanese Patent Application No. 2010-206904, filed on Sep. 15, 2010, the entire contents of which are incorporated herein by reference.

FIELD

The embodiments discussed herein are related to an apparatus and method for mounting an electronic component.

BACKGROUND

When mounting an electronic component on a printed board, a joining material that joins the electronic component to the printed board is used. The joining is performed by heating, melting, and solidifying the joining material disposed between the electronic component and the printed board. Japanese Laid-open Patent Publication No. 11-297749, Japanese Laid-open Patent Publication No. 10-303546, Japanese Laid-open Patent Publication No. 2003-152329, and Japanese Laid-open Patent Publication No. 5-198621 disclose techniques concerning the mounting or removal of an electronic component on or from a printed board.

If mounting is completed with the joining material insufficiently melted, contact failure may occur between the printed board and the electronic component.

An object of the present invention is to provide such an apparatus and method for mounting an electronic component that the state of melting of a joining material that joins the electronic component to a printed board can be determined.

SUMMARY

According to an embodiment, an apparatus for mounting an electronic component includes a heating head that moves relative to the electronic component placed on a printed board, inclines according to the inclination of the electronic component, comes into contact with the electronic component, and heats a joining material that joins the printed board and the electronic component; a first sensor that measures the position and the inclination of the heating head; a second sensor that measures the position and the inclination of the printed board; and, a control unit that calculates the position and the inclination of the electronic component on based on a measurement result of the first sensor in a state where the heating head is in contact with the electronic component, and determines the melted state of the joining material based on the measurement result of the second sensor and the position and the inclination of the electronic component.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
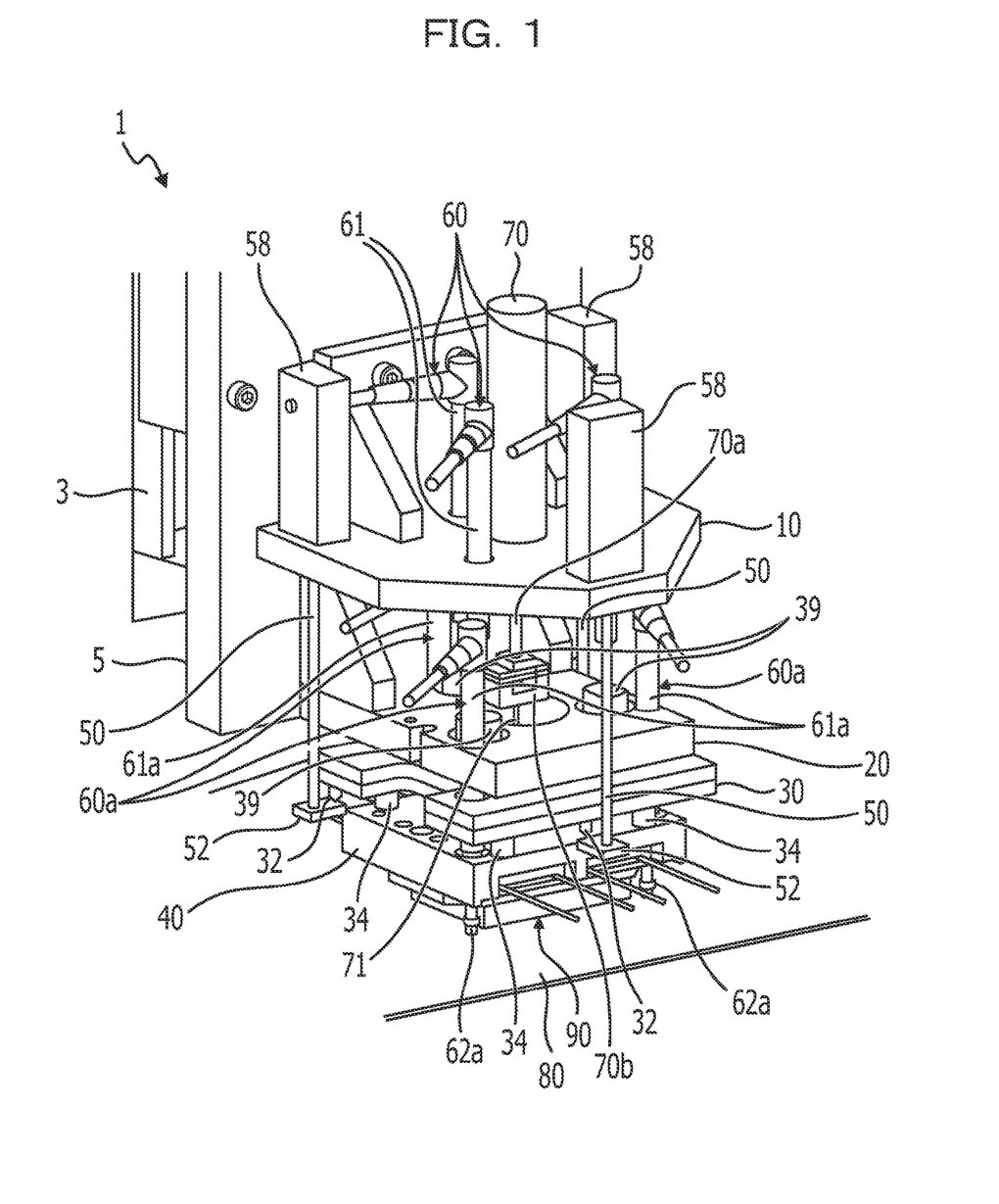
FIG. 1 shows the appearance of an apparatus for mounting an electronic component of an embodiment.
Figure 2:
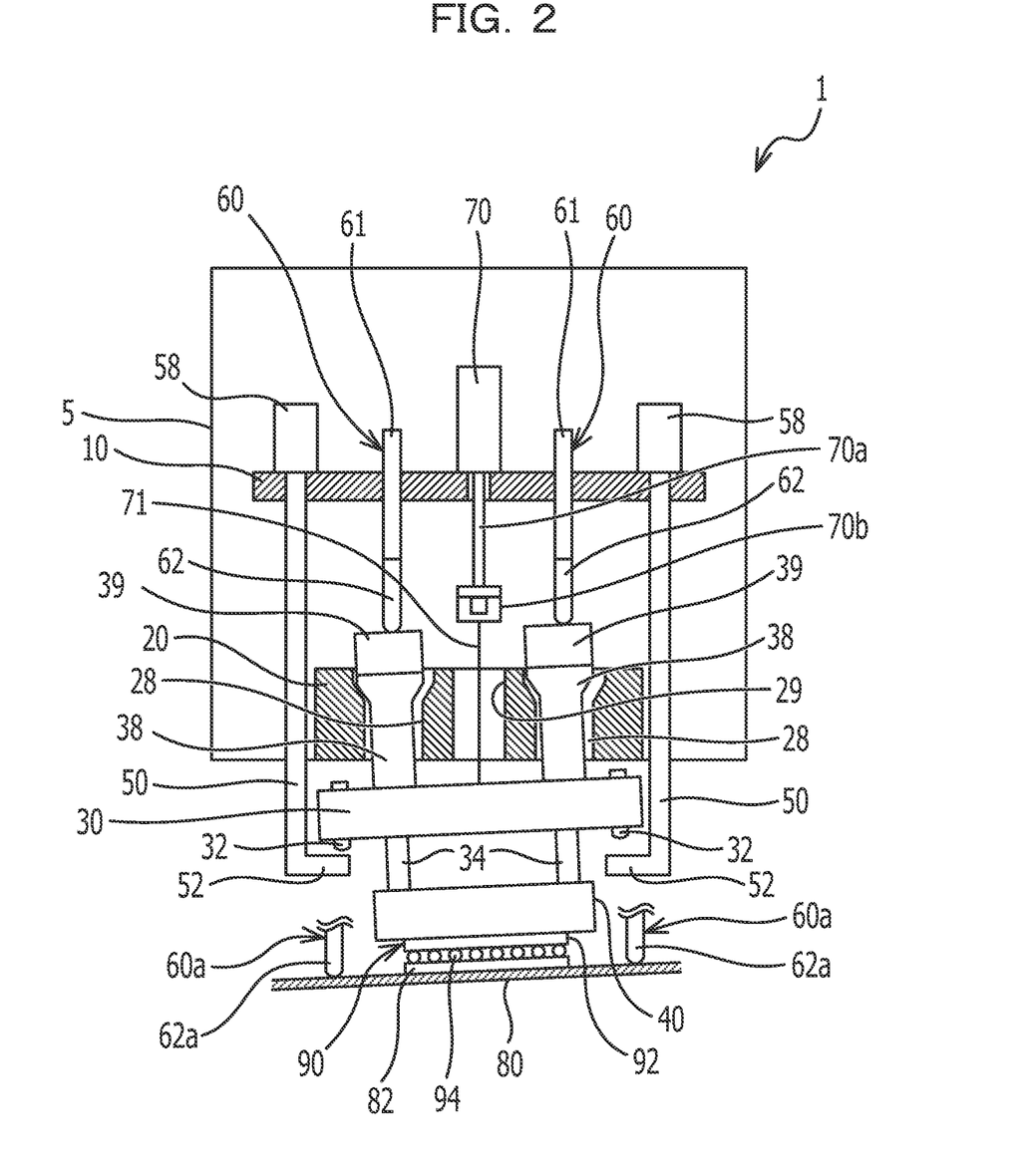
FIG. 2 shows a section of the apparatus for mounting an electronic component.

A mounting apparatus 1 is used mainly for remounting an electronic component in a rework process, and can also be used for normal mounting in a process other than a rework process. FIGS. 1 and 2 show the mounting of an electronic component 90 on a printed board 80 using the mounting apparatus 1.

The mounting apparatus 1 includes a control unit 2, a lifting and lowering actuator 3, a supporting wall 5, supporting plates 10 and 20, a movable plate 30, a heating head 40, first sensors 60, and second sensors 60a. The control unit 2 includes a CPU, ROM, RAM, and the like, and controls the movement of the whole of the mounting apparatus 1. The supporting wall 5 is supported by the lifting and lowering actuator 3 so as to be able to be lifted and lowered. The lifting and lowering actuator 3 is controlled by the control unit 2. The supporting plates 10 and 20 are fixed to the supporting wall 5. The movable plate 30 is connected to the supporting plate 20. The heating head 40 is connected by connecting rods 34 to the underside of the movable plate 30. The heating head 40 is disposed on the surface of an electronic component 90 disposed on a printed board 80. The heating head 40 is formed of a highly heat-conductive material such as copper. The underside of the heating head 40 is flat.

Figure 3:
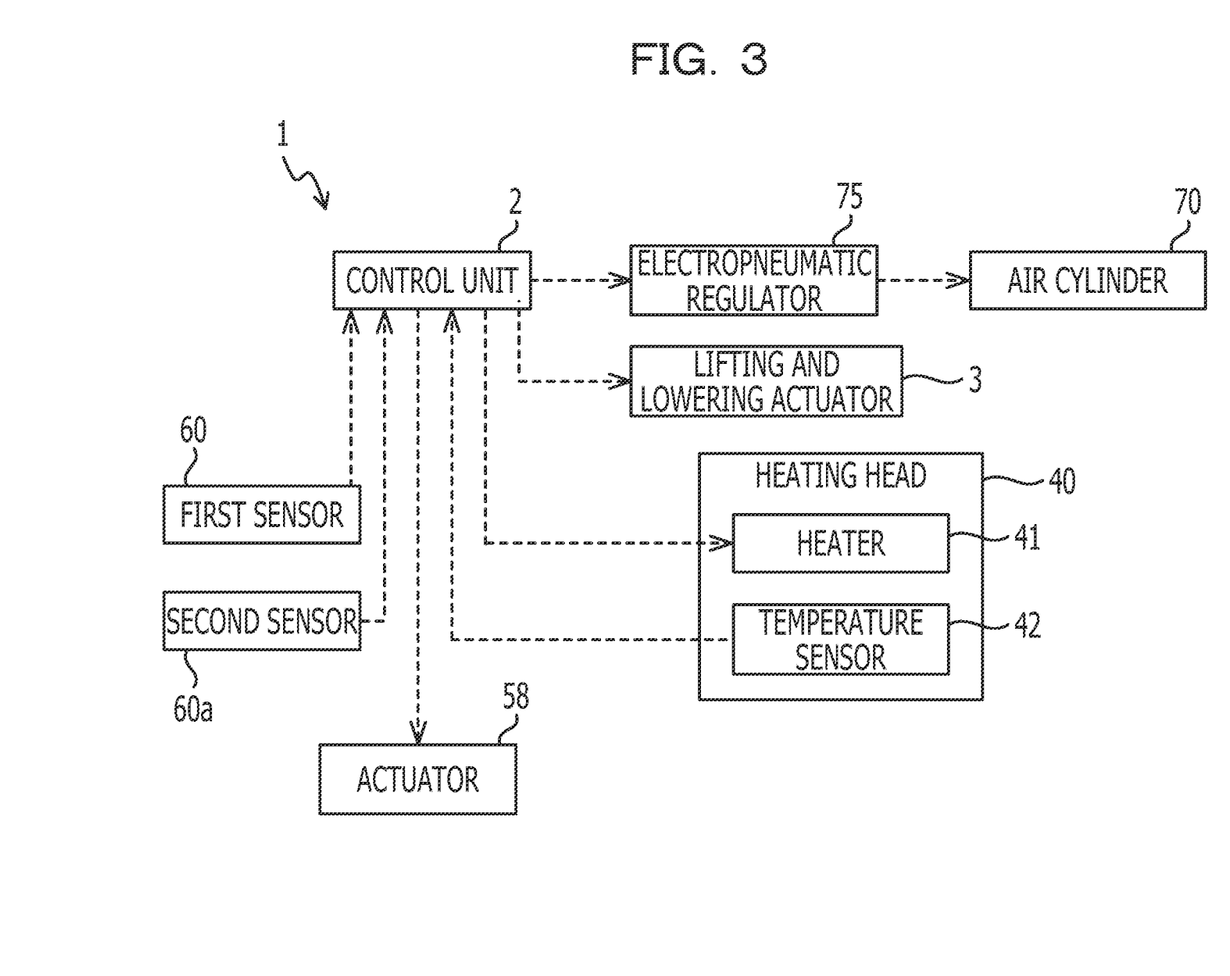
FIG. 3 is a block diagram of the apparatus for mounting an electronic component.

As shown in FIG. 3, the heating head 40 has a built-in heater 41 and temperature sensor 42. The temperature sensor 42 is, for example, a thermistor. The heater 41 is formed of a highly heat-conductive metal material such as copper. A heating wire is embedded in the heater 41. A current supplied to the heating wire causes the heating wire to generate heat energy. The heat energy causes the heater 41 to radiate heat. Thus, the heating head 40 radiates heat.

As shown in FIG. 1, three actuators 58 are placed on the supporting plate 10. In FIG. 2, only two of the three actuators 58 are shown. Each actuator 58 is connected to a stopper 50. The stoppers 50 in the embodiment are shaped like rods extending vertically downward. At the tips of the stoppers 50, supporting portions 52 are formed. The supporting portions 52 in the embodiment are shaped like flat plates. Driven by the actuators 58, the stoppers 50 move up and down. The mounting apparatus 1 commands the actuators 58, thereby regulating the positions of the stoppers 50. The positions of the three stoppers 50 are regulated independently of each other. The stoppers 50 have a function to come into contact with the movable plate 30 and to thereby define the stopping position of the heating head 40 connected to the movable plate 30.

Three supporting pins 32 are passed through the movable plate 30. Only two of the three supporting pins 32 are shown in FIGS. 1 and 2. The supporting portions 52 of the three stoppers 50 come into contact with the three supporting pins 32. As shown in FIG. 1, the supporting pins in the embodiment 32 have conical tips. Straight lines connecting the three supporting pins 32 form a substantially equilateral triangle as viewed from above the movable plate 30. That is, the movable plate 30 is supported at three points by the three stoppers 50. Thus, as will hereinafter be described in detail, the stoppers 50 can define the stopping position of the heating head 40 with the heating head 40 having a predetermined inclination. In FIGS. 1 and 2, the supporting pins 32 and the supporting portions 52 are out of contact with each other.

Three supporting rods 38 are fixed to the upper surface of the movable plate 30. In FIG. 2, only two of the three supporting rods 38 are shown. Straight lines connecting the three supporting rods 38 form a substantially equilateral triangle as viewed from above. The upper end portions 39 of the three supporting rods 38 are in contact with three first sensors 60. In FIG. 2, only two of the three first sensors 60 are shown.

As shown in FIG. 2, the supporting rods 38 are passed through the through-holes 28 of the supporting plate 20 such that there is play therebetween. The upper end portions 39 of the supporting rods 38 are larger in diameter than the other portions of the supporting rods 38. The through-holes 28 are formed so as to correspond to the shape of the supporting rods 38. Because the supporting rods 38 are passed through the through-holes 28 of the supporting plate 20 such that there is play therebetween, the supporting rods 38 can be inclined to the direction of the axes of the through-holes 28. The supporting rods 38, the movable plate 30, and the heating head 40 are integrally connected. For this reason, the heating head 40 is connected to the supporting plate 20 by the supporting rods 38 and the through-holes 28 so as to be able to be inclined. The supporting rods 38 are indirectly fixed to the heating head 40. Therefore, the heating head 40 is supported so as to be able to be inclined according to the inclination of the electronic component 90 mounted on the printed board 80.

An air cylinder 70 is placed on the supporting plate 10. The air cylinder 70 has a shaft 70a extending in the vertical direction. A connecting portion 70b is connected to the lower end of the shaft 70a. A ball is held in the connecting portion 70b. The ball is connected to one end of a wire 71, and the other end of the wire is connected to the movable plate 30. The ball is held by the connecting portion 70b so as to be able to be rolled by the weight from the movable plate 30. The supporting plate 10 is provided with a hole for passing the wire 71. The supporting plate 20 is also provided with a hole 29 for passing the wire 71. The air cylinder 70 moves the shaft 70a up and down, thereby moving the wire 71 up and down. Thus, the air cylinder 70 can regulate the pressure on the electronic component 90 when the heating head 40 is placed on the electronic component 90. As shown in FIG. 3, an electropneumatic regulator 75 controls the pressure of compressed air supplied to the air cylinder 70. The electropneumatic regulator 75 is controlled on the command of the control unit 2.

The first sensors 60 are contact-type displacement sensors. The three first sensors 60 are fixed to the supporting plate 10. Each first sensor 60 includes an outer cylinder 61 fixed to the supporting plate 10, and an inner cylinder 62 connected to the outer cylinder 61 so as to be able to move up and down relative to the outer cylinder 61. Each first sensor 60 outputs an output value corresponding to the position of the inner cylinder 62 relative to the outer cylinder 61 to the control unit 2. The inner cylinders 62 are normally in contact with the upper end portions 39 of the supporting rods 38 due to their own weights. The length from the supporting rods 38 to the heating head 40 is constant. For this reason, the control unit 2 can calculate the position of the heating head 40 on the basis of the output values from the first sensors 60. Because the three first sensors 60 are provided, the control unit 2 can calculate the position and inclination of the heating head 40 from the positions of three points of the heating head 40.

The control unit 2 calculates the position and inclination of the electronic component 90 from the position and inclination of the heating head 40. In the case where the underside of the heating head 40 is in contact with the upper surface of a semiconductor chip 92, the distance from the heating head 40 to the electronic component 90 is constant, and therefore the position and inclination of the electronic component 90 can be calculated on the basis of the position and inclination of the heating head 40.

The second sensors 60a are contact-type displacement sensors. The three second sensors 60a are fixed to the supporting plate 20. Each second sensor 60a includes an outer cylinder 61a fixed to the supporting plate 20, and an inner cylinder 62a connected to the outer cylinder 61a so as to be able to move up and down relative to the outer cylinder 61a. The second sensors 60a have the same function as that of the first sensors 60. The second sensors 60a are passed through through-holes formed in the movable plate 30 and the heating head 40. The through-holes have such a size that even if the movable plate 30 and the heating head 40 are inclined, the second sensors 60a do not come into contact with the inner surfaces of the through-holes. The outer cylinders 61a of the second sensors 60a come into contact with the printed board 80 when an electronic component is mounted. Each second sensor 60a outputs an output value corresponding to the position of the printed board 80 to the control unit 2. Because the three second sensors 60a are provided, the control unit 2 can calculate the positions of three points on the printed board 80, and can calculate the position and inclination of the printed board 80 on the basis thereof.

The electronic component 90 mounted by the mounting apparatus 1 of the embodiment will be described. The electronic component 90 is a so-called BGA (Ball Grid Array) type electronic component. The electronic component 90 includes a semiconductor chip 92, and a plurality of pieces of a joining material 94 provided on the reverse side of the semiconductor chip 92. The semiconductor chip 92 is resin-sealed. The joining material 94 is solder. Before mounting, the electronic component 90 is disposed on a terminal portion 82 of the printed board 80. The joining material 94 is in the solid state before heating. The pieces of the joining material 94 are arranged in an array. The printed board 80 is held by a jig (not shown) with both ends nipped by the jig. The printed board 80 may be a printed board on both surfaces of which electronic components are already mounted.

A method for mounting an electronic component will be described.

Figure 4:
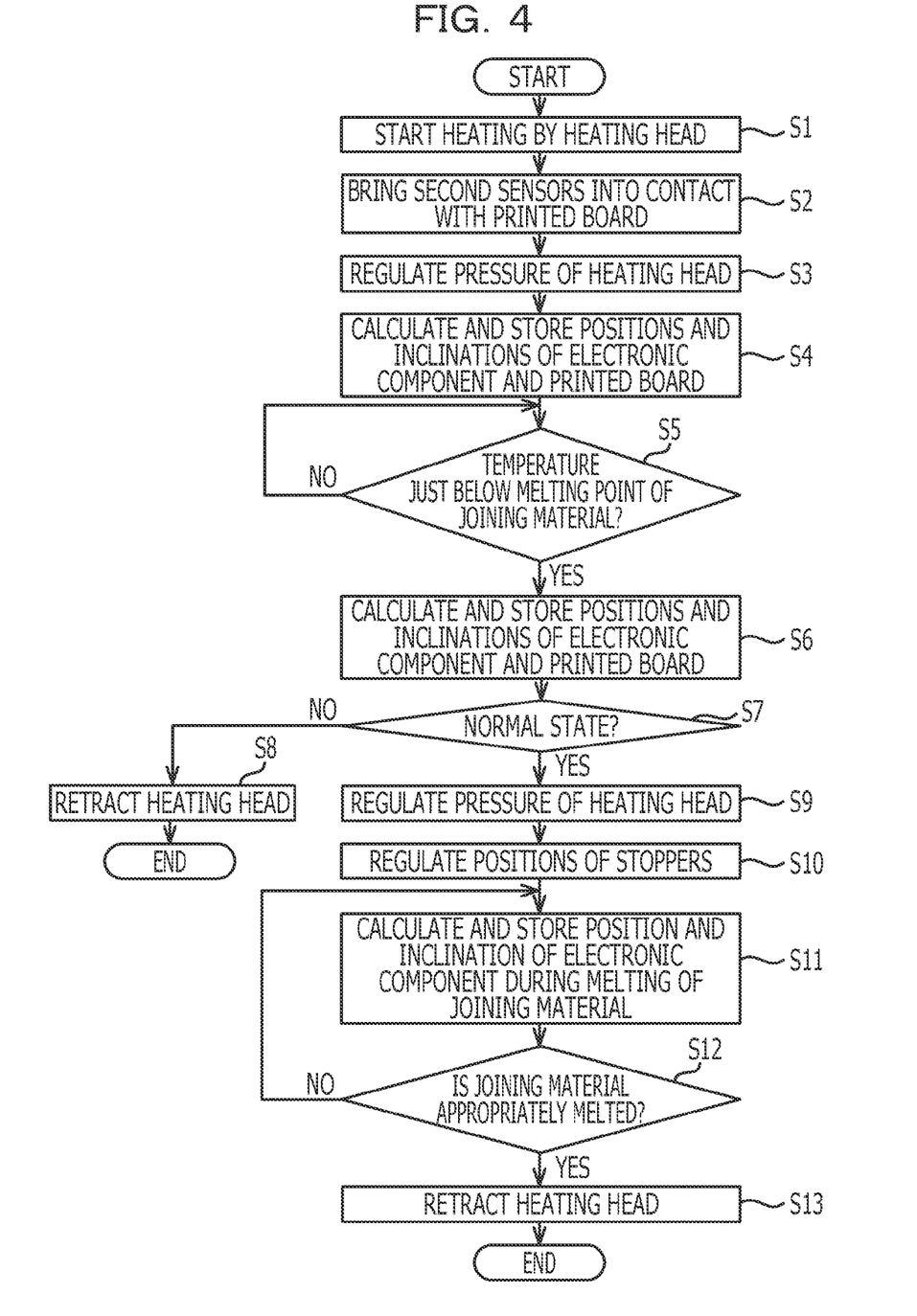
FIG. 4 is a flowchart of a method for mounting an electronic component.
Figure 5A:
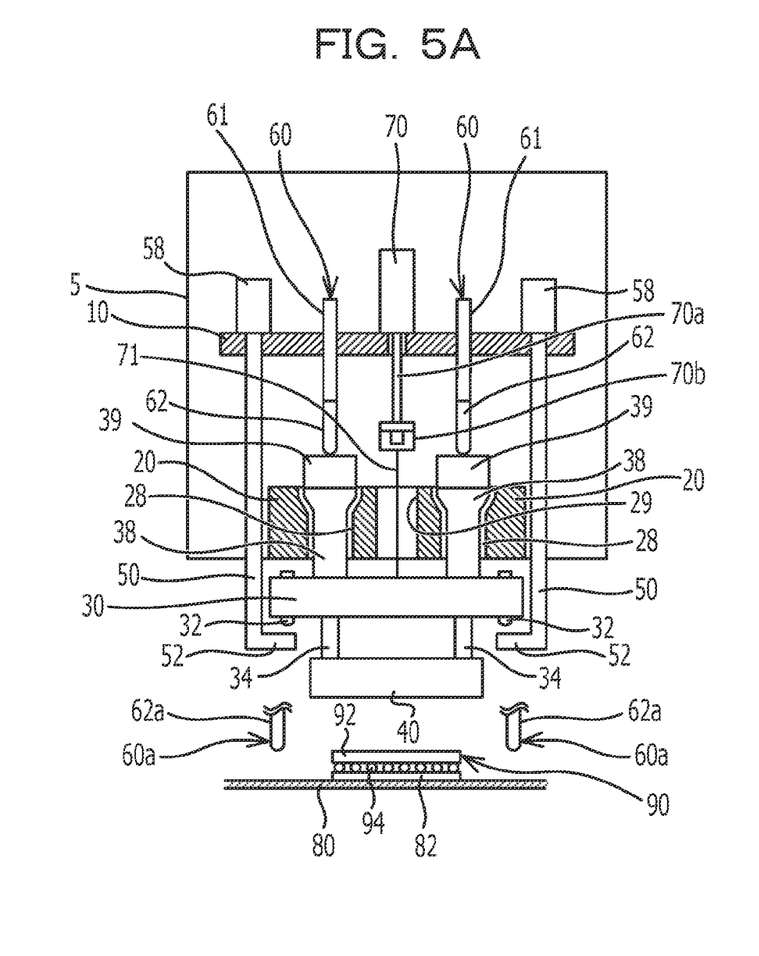
FIG. 5A and FIG. 5B show the method for mounting an electronic component.

FIG. 4 is a flowchart showing an example of a method for mounting an electronic component. FIGS. 5A, 5B, 6A, and 6B illustrate a method for mounting an electronic component. FIG. 5A shows a state where an electronic component 90 is placed on a printed board 80. The heating head 40 is retracted from the electronic component 90. Due to the fact that the upper end portions 39 of the supporting rods 38 are in contact with the inner surfaces of the through-holes 28, the movable plate 30 and the heating head 40 are held by the supporting plate 20. The second sensors 60a are retracted from the printed board 80.

Figure 5B:
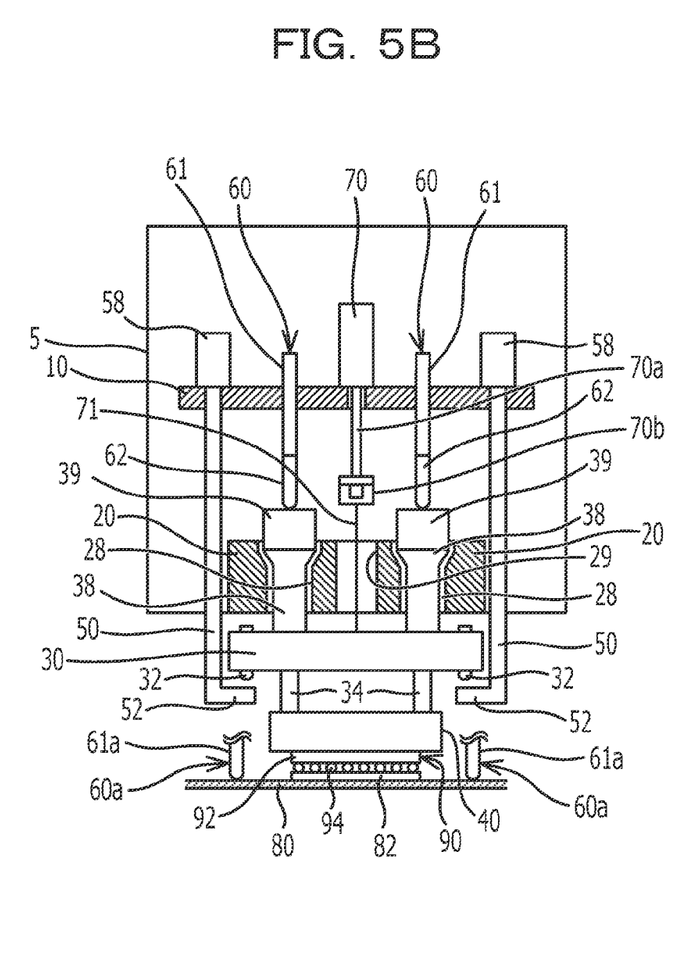

From the state shown in FIG. 5A, the heater 41 is activated. As shown in FIG. 5B the supporting wall 5 is lowered by the lifting and lowering actuator 3 and the heating head 40 is placed on the surface of the semiconductor chip 92 of the electronic component 90, and the heating of the joining material 94 is started (step S1). The second sensors 60a are brought into contact with the printed board 80 (step S2).

When the supporting wall 5 is lowered, as shown in FIG. 5B, the supporting rods 38 go out of contact with the inner surfaces of the through-holes 28. In this state, the control unit 2 regulates the pressure on the electronic component 90 using the air cylinder 70 such that the pressure on the electronic component 90 does not become excessively high (step S3). Because the supporting rods 38 are out of contact with the inner surfaces of the through-holes 28, the supporting rods 38 can be inclined to the direction of the axes of the through-holes 28 to some extent. Thus, if the printed board 80 is already warped before heating is started and due to this, the electronic component 90 is inclined, the heating head 40 can be inclined. Because the underside of the heating head 40 is in contact with the entire surface of the semiconductor chip 92 of the electronic component 90, heat can be transferred to the plurality of pieces of the joining material 94 substantially evenly.

The control unit 2 calculates the position and inclination of the electronic component 90 on the basis of the output values from the first sensors 60, calculates the position and inclination of the printed board 80 on the basis of the output values from the second sensors 60a, and stores them in the RAM (step S4). The second sensors 60a may come into contact with a component mounted on the printed board 80.

Next, on the basis of the output value from the temperature sensor 42, the control unit 2 determines whether or not the heating head 40 has reached a temperature just below the melting point of the solder (step S5). The melting point of the solder is, for example, 230° C., and the temperature just below the melting point of the solder is, for example, 217° C. When the heating head 40 has reached the temperature just below the melting point of the solder, it can be presumed that the heat of the heating head 40 is sufficiently transferred also to the printed board 80. The time required for heating the printed board may be preliminarily measured and recorded, and the determination may be performed on the basis of time.

Figure 6A:
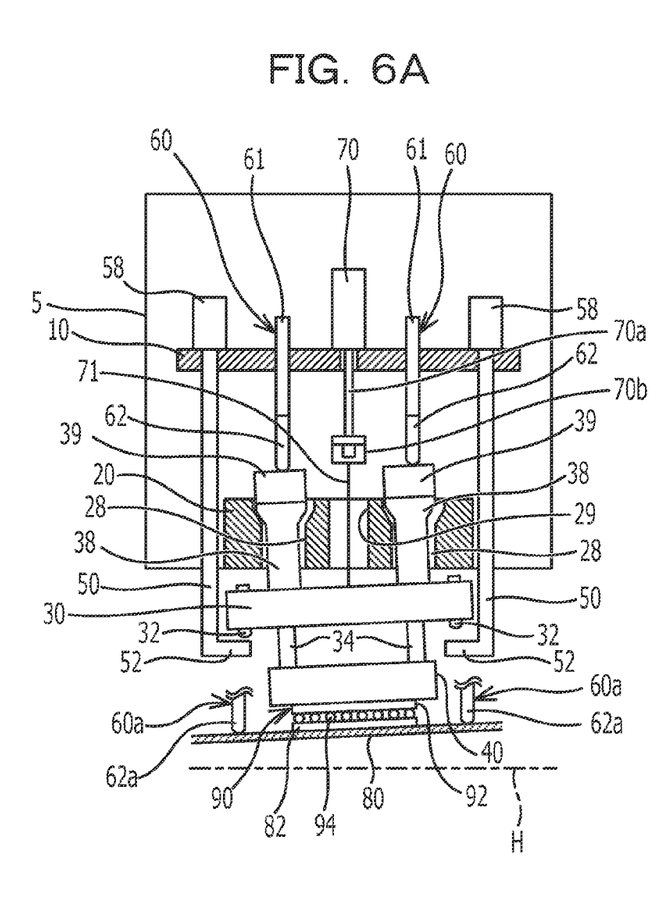
FIG. 6A and FIG. 6B show the method for mounting an electronic component.

FIG. 6A shows a state after the start of heating and before the melting of the joining material 94. Due to the fact that the heating head 40 heats the electronic component 90, heat is transferred to the printed board 80 and the printed board 80 can warp. If the printed board 80 warps, the electronic component 90 inclines. As described above, the heating head 40 is connected to the supporting plate 20 so as to be able to be inclined, and therefore the heating head 40 can cope with the warpage of the printed board 80 caused by the heat of the heating head 40. A horizontal line H is shown in FIG. 6A.

When the heating head 40 has reached the temperature just below the melting point of the joining material 94, the control unit 2 calculates the positions and inclinations of the electronic component 90 and the printed board 80 on the basis of the output values from the first sensors 60 and the second sensors 60a, and stores them in the RAM (step S6). That is, the control unit 2 calculates the positions and inclinations of the printed board 80 and the electronic component 90 just before the melting of the joining material 94. Instead of coming into contact with the printed board 80, the second sensors 60a may come into contact with a component mounted on the printed board 80. By comparing to the measurement results in step S4, the change in the position of the printed board 80 before and after the transfer of heat of the heating head 40 to the printed board 80 can be calculated.

Next, the control unit 2 determines whether or not the states of the electronic component 90 and the printed board 80 are normal on the basis of the positions and inclinations of the electronic component 90 and the printed board 80 calculated in step S4 and the positions and inclinations of the electronic component 90 and the printed board 80 just before the melting of the joining material 94 calculated in step S6 (step S7). Specifically, for example, when there is a significant difference between the position and inclination of the electronic component 90 calculated in step S4 and the position and inclination of the electronic component 90 calculated in step S6, the control unit 2 determines that there is a gap between the heating head 40 and the electronic component 90, the heating head 40 does not normally follow the electronic component 90, and therefore the state is abnormal. In steps S4 and S6, the second sensors 60a may come into contact with a component mounted on the printed board 80. If the control unit 2 determines that the state is abnormal, the control unit 2 drives the lifting and lowering actuator 3 and retracts the heating head 40 from the electronic component 90 (step S8).

If the control unit 2 determines that the state is normal, the control unit 2 regulates the pressure of the heating head 40 (step S9). Specifically, the control unit 2 controls the electropneumatic regulator 75 and the air cylinder 70 such that the pressure of the heating head 40 on the electronic component 90 is about 10 gf.

Next, the control unit 2 regulates the positions of the stoppers 50 (step S10). Specifically, the control unit 2 calculates the target stopping position and the inclination at the target stopping position of the heating head 40 on the basis of the position and inclination of the printed board 80 just before the melting of the joining material 94 calculated in step S6. The control unit 2 regulates the stoppers 50 such that the heating head 40 moving down with the melting of the joining material 94 stops at the target stopping position and with the inclination at the target stopping position.

Specifically, the control unit 2 sets the inclination at the target stopping position of the stoppers 50 such that the printed board 80 and the electronic component 90 are substantially parallel to each other when the joining material 94 is melted. In other words, the control unit 2 regulates the stoppers 50 such that the inclination of the printed board 80 and the inclination of the heating head 40 just before the melting of the joining material 94 are the same. The positions of the stoppers 50 are regulated independently of each other. Therefore, if the printed board 80 is warped, the positions of the three stoppers 50 are regulated differently. The target position of the heating head 40 is such a position that the heating head 40 does not squash the melted joining material 94 and does not cause contact failure between the printed board 80 and the electronic component 90.

After the elapse of a predetermined period of time since step S9, the control unit 2 stops regulating the stoppers 50, calculates the position and inclination of the electronic component 90 during the melting of the joining material 94, and stores them in the RAM (step S11). Next, the control unit 2 determines whether or not the joining material 94 is appropriately melted on the basis of the position and inclination of the electronic component 90 just before the melting of the joining material 94 calculated in step S6 and the position and inclination of the electronic component 90 during the melting of the joining material 94 calculated in step S11 (step S12). Specifically, if the difference between the inclinations of the electronic component 90 just before and during the melting of the joining material 94 is within a predetermined range, and the difference between the positions of the electronic component 90 just before the melting of the joining material 94 (step S6) and during the melting of the joining material 94 (step S12) is within a predetermined range, the control unit 2 determines that the joining material 94 is appropriately melted. For example, if the inclinations of the electronic component 90 just before and during the melting of the joining material 94 are substantially the same, and the difference in the position of the electronic component 90 is within a predetermined range, the control unit 2 determines that the joining material 94 is appropriately melted. Here, the predetermined range is preliminarily set in the control unit 2. The value is, for example, 50 microns. Although the determination of step S12 is performed on the basis of the position of the electronic component 90 in this embodiment, the determination may be performed on the basis of temperature or time.

Figure 6B:
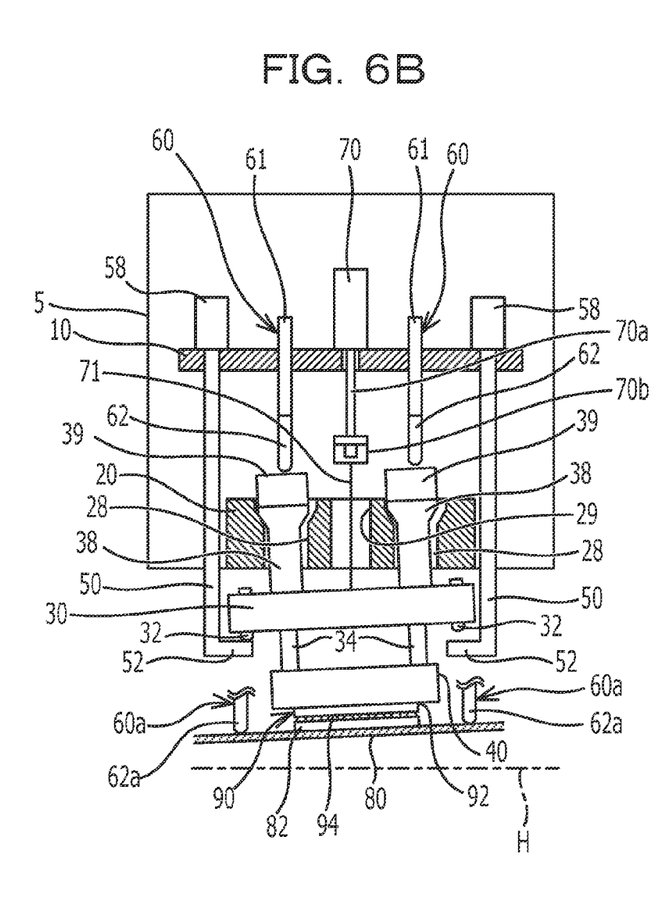

In this case, the heating head 40 is stopped at the target stopping position by the stoppers 50. By stopping the heating head 40 at the target stopping position, a certain gap is secured between the underside of the heating head 40 and the surface of the printed board 80, and electric conduction between the electronic component 90 and the printed board 80 by the joining material 94 can be secured. Because the inclination of the heating head 40 is set such that the printed board 80 and the underside of the heating head 40 are parallel to each other, the surface of the printed board 80 and the surface of the semiconductor chip 92 are substantially parallel to each other as shown in FIG. 6B. Thus, the electronic component 90 can be prevented from being mounted with the semiconductor chip 92 inclined to the printed board 80. In addition, some of the plurality of pieces of the joining material 94 can be prevented from being squashed and causing contact failure.

For example, when the difference between the positions of the electronic component 90 just before and during the melting of the joining material 94 is too small, it can be determined that the melting of the joining material 94 is insufficient. In this case, the heating head 40 has not yet reached the target stopping position. When the difference between the inclinations of the electronic component 90 just before and during the melting of the joining material 94 is too large, it can be determined that some of the plurality of pieces of the joining material 94 are not sufficiently melted. In this case, the control unit 2 performs step S11 again, calculates and stores the position and inclination of the electronic component 90 during the melting of the joining material 94, and continues the heating of the joining material 94 by the heating head 40. If it is determined that the joining material 94 is appropriately melted, the control unit 2 retracts the heating head 40 (step S13), and finishes this series of processes.

As described above, on the basis of the position and inclination of the electronic component 90 and the position and inclination of the printed board 80, it can be determined whether or not the joining material 94 is appropriately melted, and even if the printed board 80 is warped, the electronic component 90 can be appropriately mounted. For example, the electronic component 90 can be mounted on the printed board 80 with the whole of one surface of the printed board 80 attracted to a predetermined stage in order to correct the warpage of the printed board 80. However, in the case where electronic components are already mounted on both surfaces of the printed board 80, the whole of one surface of the printed board 80 cannot be attracted to a stage. According to the apparatus 1 and method for mounting of this embodiment, one surface of the printed board 80 need not be attracted to a stage. Therefore, the apparatus and method for mounting of this embodiment can mount an electronic component also on a printed board on both surfaces of which electronic components are already mounted.

In step S12, it is determined whether or not the joining material 94 is appropriately melted on the basis of the positions and inclinations of the electronic component 90 just before and during the melting of the joining material 94. However, it may be determined whether or not the joining material 94 is appropriately melted, by the following method. The control unit 2 may determine whether or not the heating head 40 is stopped at the calculated target stopping position with the calculated inclination, on the basis of the output values from the first sensors 60. The reason is that when the heating head 40 is stopped at the target stopping position with the calculated inclination, the joining material 94 is appropriately melted and the printed board 80 and the electronic component 90 are substantially parallel to each other, and it can be determined that the joining material 94 is appropriately melted.

Figure 7:
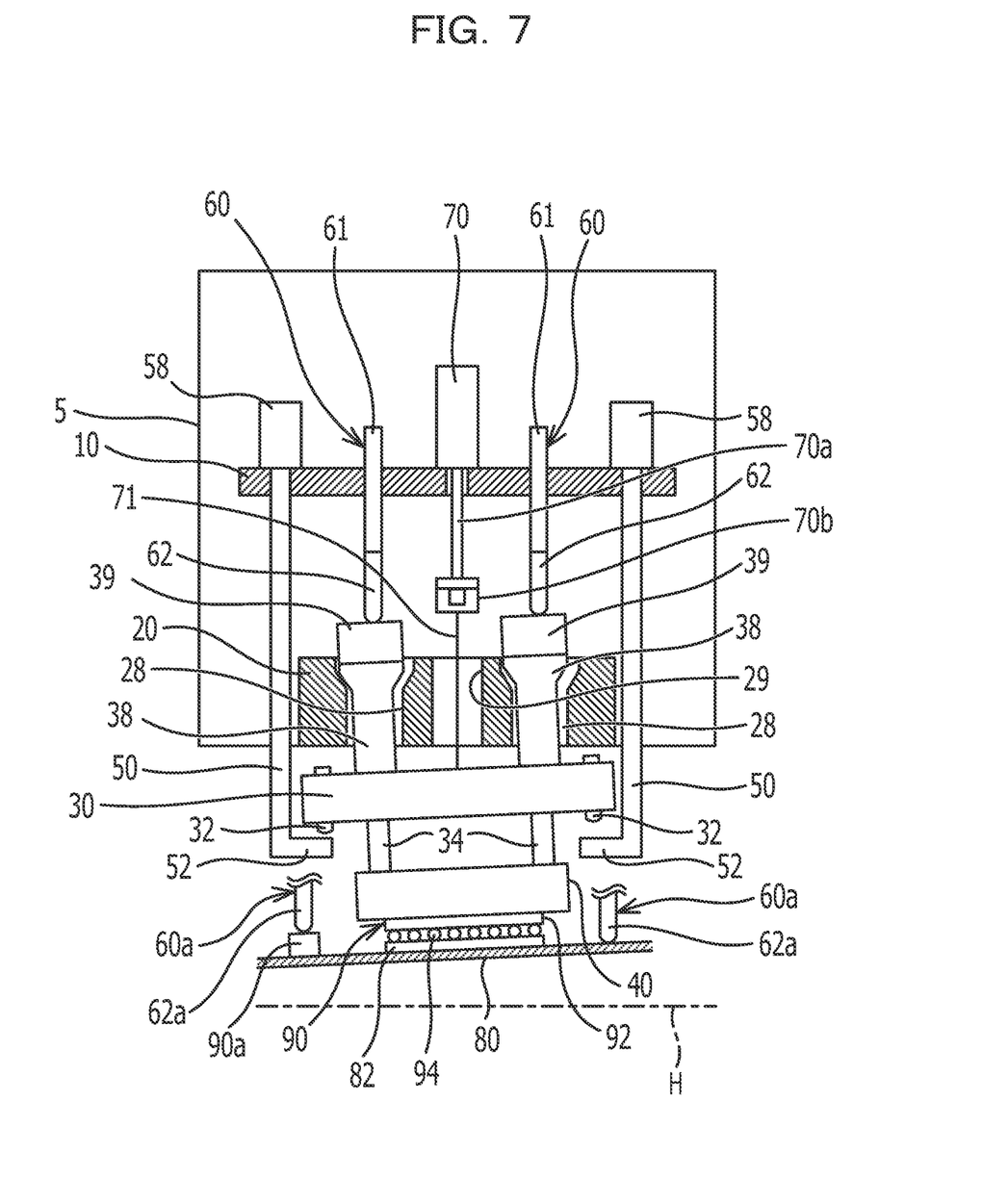
FIG. 7 shows a method for mounting an electronic component on a densely mounted printed board.

Next, a description will be given of the case where an electronic component 90 is mounted on a printed board 80 on which electronic components are densely mounted. FIG. 7 illustrates the case where an electronic component 90 is mounted on a printed board 80 on which electronic components are densely mounted. As shown in FIG. 7, in the vicinity of the part of the printed board 80 where the electronic component 90 is to be mounted, another electronic component 90a is already mounted. One of the second sensors 60a is in contact with the upper surface of the electronic component 90a. The other second sensors 60a are in contact with the printed board 80. In this case, the height of the electronic component 90a from the surface of the printed board 80 is preliminarily input into the control unit 2. The position and inclination of the printed board 80 can be calculated by deducting the height of the electronic component 90a. As described above, the apparatus and method for mounting of this embodiment can mount an electronic component also on a printed board on which electronic components are already densely mounted. In step S2 of FIG. 4, the height of the electronic component 90a may be measured using the second sensors 60a.

The stoppers 50 are out of contact with the printed board 80. Thus, the stoppers 50 are prevented from interfering with the other electronic component mounted on the printed board 80. Thus, the apparatus and method for mounting of this embodiment can mount an electronic component also on a printed board on which electronic components are already densely mounted.

As described above, the apparatus and method for mounting of this embodiment can mount an electronic component on a printed board on both surfaces of which electronic components are already mounted and a printed board on which electronic components are already densely mounted, and can mount an electronic component on various printed boards.

Although contact-type displacement sensors are used in the above embodiment, any other type of sensor may be used as long as it can measure the position and inclination of the heating head 40 and the printed board 80. For example, a scanning sensor or noncontact-type sensor may be used.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

The invention claimed is:

1. An apparatus for mounting an electronic component, the apparatus comprising:
    a heating head is configured to move relative to the electronic component placed on a printed board, to incline according to an inclination of the electronic component, to come into contact with the electronic component, and to heat a joining material that joins the printed board and the electronic component;

a first sensor that measures the position and an inclination of the heating head;

a second sensor that measures a position and an inclination of the printed board; and a control unit is configured to calculate a position and the inclination of the electronic component based on a measurement result of the first sensor in a state where the heating head is in contact with the electronic component, and to determine a melted state of the joining material based on the measurement result of the second sensor and the position and the inclination of the electronic component.

2. The apparatus according to claim 1, wherein the second sensor is positioned to measure three points including the printed board and another electronic component; and the control unit calculates the position and the inclination of the printed board based on a measurement result of the second sensor and a height of the other electronic component from the printed board.

3. The apparatus according to claim 1, wherein the control unit is configured to retract the heating head from the electronic component according to the determination result of the state of melting of the joining material.

4. The apparatus according to claim 1, wherein the control unit is configured to set a position of a stopper at a target stopping position and an inclination at the target stopping position for the heating head on the basis of the measurement result of the second sensor.

5. The apparatus according to claim 4, wherein the control unit is configured to calculate the target stopping position and the inclination at the target stopping position based on a measurement result of the second sensor after the start of heating by the heating head and before the melting of the joining material.

6. The apparatus according to claim 4, wherein the stopper includes three stoppers each having an independently regulated position.

* * * * *